US007999545B2

(12) United States Patent
Ullmann

(10) Patent No.: US 7,999,545 B2
(45) Date of Patent: Aug. 16, 2011

(54) METHOD FOR OBTAINING AMPLITUDE AND PHASE PROFILES OF RF PULSES FOR SPATIALLY SELECTIVE EXCITATION

(75) Inventor: Peter Ullmann, Karlsruhe (DE)

(73) Assignees: Bruker BioSpin MRI GmbH, Ettlingen (DE); Universitaetsklinikum Freiburg, Freiburg (DE)

( * ) Notice: Subject to any disclaimer, the term of this patent is extended or adjusted under 35 U.S.C. 154(b) by 296 days.

(21) Appl. No.: 12/517,573

(22) PCT Filed: Dec. 5, 2007

(86) PCT No.: PCT/DE2007/002183
§ 371 (c)(1),
(2), (4) Date: Jun. 4, 2009

(87) PCT Pub. No.: WO2008/071155
PCT Pub. Date: Jun. 19, 2008

(65) Prior Publication Data
US 2010/0066362 A1      Mar. 18, 2010

(30) Foreign Application Priority Data

Dec. 9, 2006   (DE) .......................... 10 2006 058 162

(51) Int. Cl.
*G01V 3/00* (2006.01)
(52) U.S. Cl. ........................ 324/314; 324/309
(58) Field of Classification Search .................. 324/314, 324/307, 309
See application file for complete search history.

(56) References Cited

U.S. PATENT DOCUMENTS

| 5,758,646 | A |   | 6/1998 | Van Der Meulen et al. |
|---|---|---|---|---|
| 5,821,752 | A | * | 10/1998 | LeRoux ........................ 324/314 |
| 6,307,368 | B1 | * | 10/2001 | Vasanawala et al. ......... 324/309 |
| 6,472,870 | B1 | * | 10/2002 | Bendall et al. ................ 324/307 |
| 6,965,234 | B1 | * | 11/2005 | Cunningham et al. ........ 324/314 |
| 7,078,899 | B2 |   | 7/2006 | Dale et al. |
| 2005/0110488 | A1 |   | 5/2005 | Zhu |

(Continued)

OTHER PUBLICATIONS

Grissom W. et al. "Spatial domain method for the design of RF pulses in multicoil parallel excitation", Magnetic Resonance in Medicine Wiley USA, vol. 56, Nr. 3, Sep. 2006, Pa. 620-629.

(Continued)

*Primary Examiner* — Louis Arana
(74) *Attorney, Agent, or Firm* — Paul Vincent

(57) ABSTRACT

A method for determining amplitude and phase dependencies of radio frequency pulses that are irradiated during traversal of a defined k-space trajectory to produce a spatial pattern of the transverse magnetization in an MR experiment using at least one RF transmission antenna, is characterized in that, in a calibration step, a set of basic pulses is defined, each basic pulse is irradiated individually, the specified k-space trajectory is traversed and at least one set of basic patterns is produced by detection of the MR signals thus excited, which in a range to be examined of the object, are proportional to the complex transverse magnetization produced, wherein the k-space trajectory is traversed fully identically every time at least from the beginning of the irradiation of each basic pulse, and, in a calculation step, a defined target pattern is approximated with a linear combination of the basic patterns of a set or with a mathematical association of linear combinations, with which, within each set, the basic patterns are identically combined, and the amplitude and phase dependencies to be determined are obtained as the corresponding linear combination of the basic pulses. Experimental imperfections can be intrinsically compensated for in this way.

15 Claims, 11 Drawing Sheets

U.S. PATENT DOCUMENTS

2010/0253336 A1* 10/2010 Schneider et al. ............ 324/309
2010/0286500 A1* 11/2010 Ruhm ........................... 600/410

OTHER PUBLICATIONS

Saekho S. et al. "Fast-kz three-dimensional tailored radiofrequency pulse for reduced B1 inhomogeneity", Magnetic Resonance in Medicine Wiley USA, vol. 55, Nr. 4, Apr. 2006, Pa. 719-724.

Yip C.Y. "Iterative RF pulse design for multidimensional,small-tip-angle selective excitation", Magnetic Resonance in Medicine vol. 54 (2005), Pa. 908-917.

Pauly J. et al. "A k-space analysis of small-tip-angle excitation" Journal of Magnetic Resonance vol. 81 (1989), Pa. 43-56.

Katscher U. et al. "Transmit Sense" Magnetic Resonance in Medicine vol. 49 (2003), Pa. 144-150.

Schomberg H. et al. "Off-Resonance Correction of nD Spatially Selective RF Pulses" International Society for Magnetic Resonance in Medicine Proceedings 6th Scientific Meeting, Sydney, 1998, p. 2059.

Boernert P. et al. "On spatially selective RF excitation and its analogy with spiral MR image acquisition", Magnetic Resonance Materials in Physics, Biology and Medicine vol. 7 (1998), Pa. 166-178.

* cited by examiner

FIG 6a
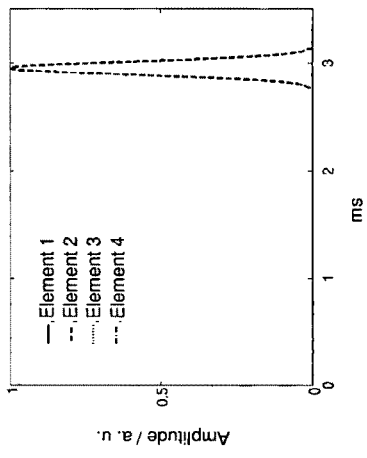
Experiment 1
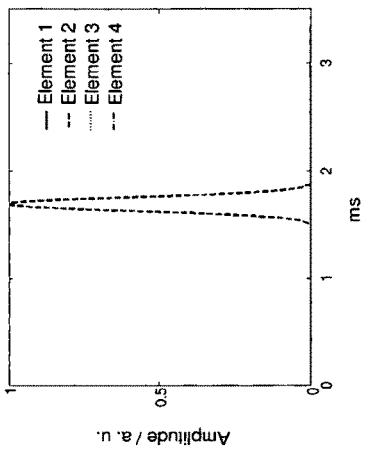
Experiment 2
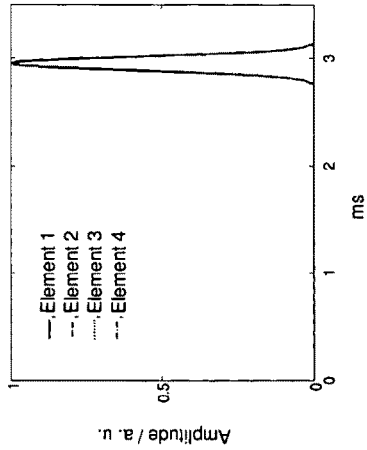
Experiment 3
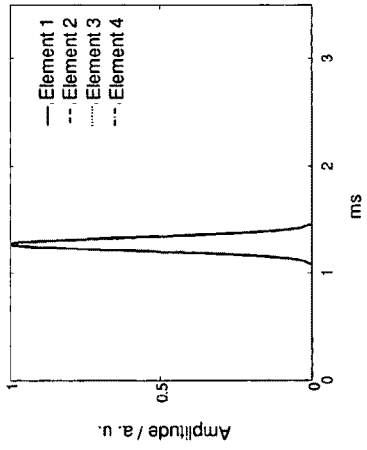
Experiment 4

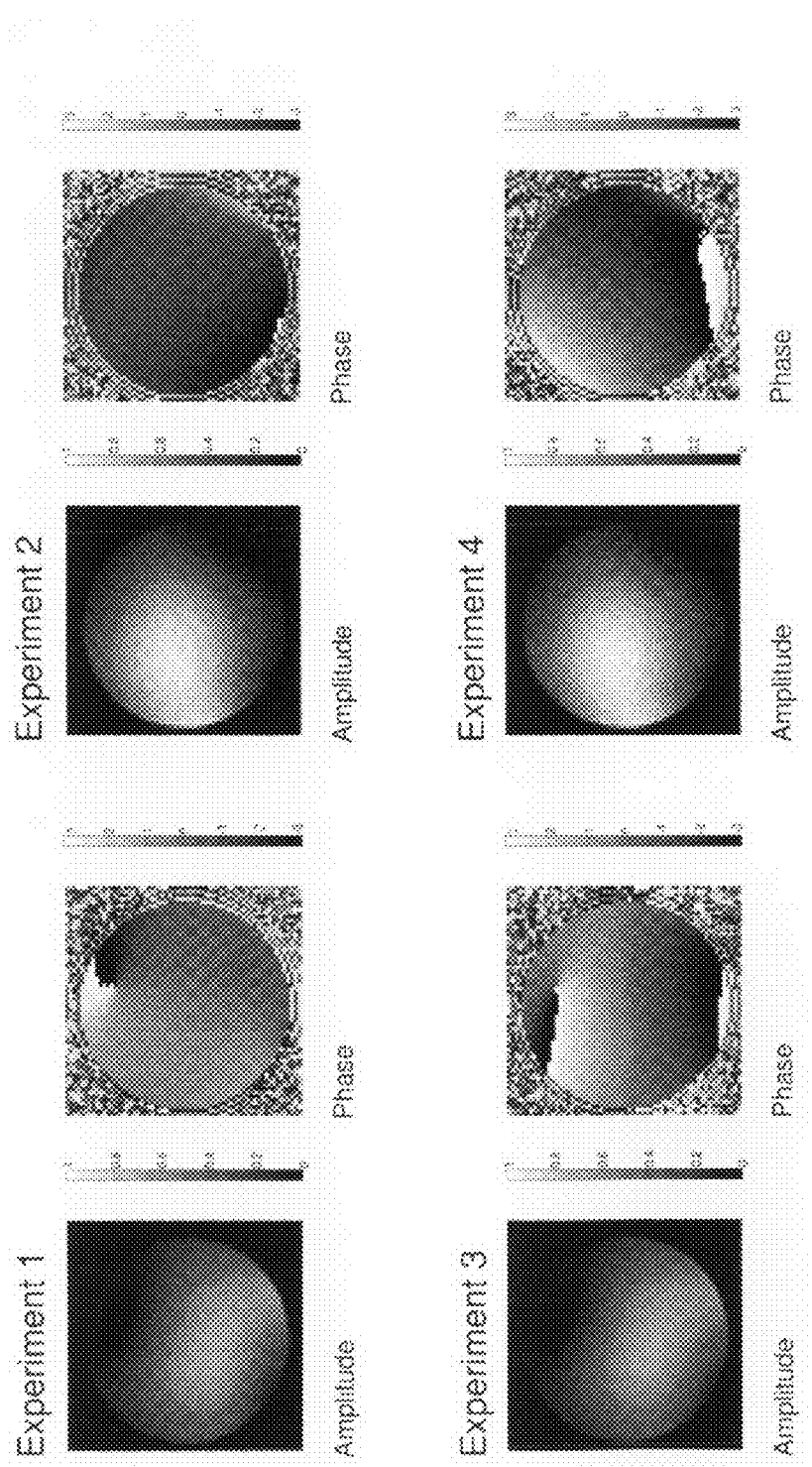

METHOD FOR OBTAINING AMPLITUDE AND PHASE PROFILES OF RF PULSES FOR SPATIALLY SELECTIVE EXCITATION

This application is the national stage of PCT/DE2007/002183 filed on Dec. 5, 2007 and also claims Paris Convention priority to DE 10 2006 012 058 162.8 filed Dec. 9, 2006.

BACKGROUND OF THE INVENTION

The invention relates to a method for determining amplitude and phase dependencies of RF pulses that, while passing through a defined k-space trajectory to produce an n-dimensional spatial pattern (n>=1) of the transverse magnetization, are irradiated into an object by means of at least one RF transmission antenna of a magnetic resonance measurement system (MR measurement system) as part of a spatially resolved magnetic resonance experiment.

Such a method is known, for example, from [6].

Magnetic resonance imaging (MRI), also known as magnetic resonance tomography (MRT), is a widely used technique for non-destructive acquisition of images of the interior of an object under examination and is based on the spatially resolved measurement of magnetic resonance signals from the object under examination. By subjecting the object under examination to an essentially static and homogeneous basic magnetic field within a basic field magnet, nuclear spins contained in it are oriented with respect to the direction of the basic field (usually the z-direction of a coordinate system referenced to the magnet). In the case of an MR examination, by irradiation of electromagnetic RF pulses by means of one or more RF transmission antennas, the nuclear spins of the object under examination thus oriented are excited into precession movements whose frequencies are proportional to the local magnetic field strengths. In the MRI methods generally used today, a spatial encoding for all three spatial directions is imposed on the precession movements of the nuclear spins by time-variable superposition of gradient fields $G_X$, $G_Y$, and $G_Z$, produced with a gradient system. This spatial encoding is usually described by a scheme in a space that is associated with physical space via a Fourier transform, called the k-space. The transverse component of the magnetization connected with the precessing nuclear spins induces voltage signals in one or more RF reception antennas that surround the object under examination. By means of pulse sequences that contain specially selected trains of RF pulses and gradient pulses, magnetic resonance signals that are variable over time are produced in such a way that they can be converted to the corresponding spatial mappings. This is performed according to one of many known reconstruction techniques by which the RF signals are acquired, amplified, and digitized by means of an electronic reception system, processed using an electronic computer system, and stored in two or three-dimensional datasets. The pulse train used typically contains a sequence of measurement operations in which the gradient pulses are varied according to the selected location method.

U.S. Pat. No. 7,078,899 B2 discloses an optimization method for k-space trajectories for use in MR imaging.

U.S. Pat. No. 5,758,646 A describes a method by which MR imaging sequences consisting of RF and gradient pulses are optimized with respect to important parameters (e.g. signal-to-noise ratio) to reduce the number of MR imaging sequences available for selection.

One important prerequisite for spatially accurate imaging of the nuclear spins of the object under examination is that the technical imperfections of the MR measurement system be negligible or that the deviations from the ideal behavior be known such that they can be corrected accordingly.

Spatially selective excitation is a widely used technique in magnetic resonance imaging that is used to spatially restrict the transverse magnetization produced during excitation and/or to vary its amplitude and phase in the excitation volume. In slice selection, the most frequent case of selective excitation, the excitation volume is reduced to a defined slice. Multidimensional selective excitation, in which the excitation volume is restricted in more than one direction or the excitation is modulated in more than one direction, has also produced numerous applications. These include the excitation of a small three-dimensional volume inside a much larger object under examination for localized spectroscopy, the mapping of a selectively excited region of interest (ROI) with a reduced field of view (FOV) for the purpose of shortening the measurement time, the excitation of special volumes adapted to structures of the object under examination, or also the echo-planar imaging with reduced echo train lengths. Moreover, amplitude and phase modulation during excitation can also be used to compensate for disadvantageous effects of an inhomogeneous B1 field of the RF antennas used for transmission. This is an application that has recently become vastly more important due to the large increases in high-field MRI systems.

In the past, spatially selective excitation was usually performed by means of a single RF transmission antenna with an essentially homogeneous transmission field (B1 field) in conjunction with the gradient system. Inspired by the success of parallel imaging, in which signal acquisition is performed with a configuration of multiple RF reception antennas, termed an antenna array in the technical literature, it has since become common practice to also deploy such arrays for transmission in selective excitation. This permits partial replacement of the spatial encoding that is implemented in selected excitation, by analogy with acquisition by varying gradient fields, by so-called sensitivity coding, thus reducing the length of the excitation pulses. This uses the information contained in the different spatial variations of the transmission profiles of the individual array elements, hereafter also termed transmission profiles. Because the length of such selective excitation pulses has usually been one of the limiting criteria for the applicability of this technique, parallel excitation (PEX) is a promising method to enable wider use of spatially selective excitation than has so far been possible.

One of the basic questions in the deployment of spatially selective excitation is the determination of the RF pulses that have to be emitted by the RF transmission system to generate the desired excitation pattern in conjunction with the k-space trajectory produced by the gradients. In the article "A k-space analysis of small tip-angle excitation" [1], Pauly et al. describe a method for one-channel spatially selective excitation with which the sought pulse shape B1 (t) can be calculated based on a mathematical analogy of the selective excitation with Fourier imaging essentially by means of a Fourier transform of the desired excitation pattern and sampling of the Fourier-transform along the defined k-space trajectory. Katscher et al. extended this calculation method to the case of an antenna array with multiple independent transmission channels [2].

However, the decisive disadvantage of the calculation methods described in these articles is that diverse experimental factors that can negatively influence accurate implementation of the excitation and manifest themselves in artifacts, depending on the specific k-space trajectory, are not or cannot be taken into account in the calculation. One example of such influencing factors are inhomogeneities of the basic magnetic field that cause the resonance frequency of the nuclear spins to no longer match the irradiated RF frequency at certain locations of the object under examination (causing off-resonances). Further factors include the relaxation of the spin system during the pulses and the deviation of the real k-space trajectory from its theoretical form defined in the calculation because of technical imperfections of the gradient system and physical interference factors such as induced eddy currents.

As a result of these disadvantages, further methods for pulse calculation for spatially selective excitation have gradually come about. In some works [3, 4], the conjugate-phase (CP) method from image reconstruction was used, which can take off-resonance effects into account and correct them to some degree. Despite the CP method's ability to correct off-resonance effects, these conventional methods for pulse calculation are less than optimal in a number of respects. The algorithms generally result in pulses that do not optimally achieve accurate implementation of the desired excitation pattern, in particular, if the k-space trajectory exhibits a degree of under-sampling or if the off-resonance influences exhibit pronounced spatial variation. A more recent method for pulse calculation introduced by Yip et al. [5] and generalized for multi-channel transmission by Grissom et al. [6], is based on an optimization method and achieves improvements in excitation accuracy in two respects. On the one hand, it is more robust than under-sampling the k-space, on the other hand, it is a simple way of taking off-resonance influences into account in pulse calculation. Moreover, it provides the possibility of including further constraints in the calculation, such as control of the integrated or also the maximum RF transmission power, which is important for SAR (specific absorption rate) control or technical restrictions on the RF power transmitters.

A general additional problem with these new methods is that relatively precise maps of the basic magnetic field variations have to be initially acquired in the region of the object under examination in order to correct for off-resonance effects. This is often difficult, especially in in-vivo conditions. To also compensate for effects of transverse relaxation in pre-calculation with these methods, which is possible in theory although not explicitly mentioned in the relevant publications, detailed determination of the spatial dependence of the $T_2^*$ relaxation times within the object under examination is also required in this case.

A further problem that is not taken into account in the stated calculation methods at all is the deviations of the actual k-space trajectory produced by the gradients from the theoretical trajectory.

The object of this invention is therefore to provide a method for determining amplitude and phase dependencies of RF pulses for one or mufti-channel spatially selective excitation, in which the experimental imperfections addressed are taken into account and intrinsically compensated for irrespective of whether they are caused by the object under examination or physical and technical constraints of the system.

SUMMARY OF THE INVENTION

This task is solved by a method according to the independent claim.

Such RF pulses are determined in several steps in this method.

In the first step, a k-space trajectory adapted to the problem is selected, that is, the trajectory must sample the k-space sufficiently in all dimensions in which spatial modulation of the transverse magnetization is performed. As part of a mufti-channel excitation, a certain degree of under-sampling may be permissible whose maximum magnitude is limited by the number of array elements and the nature of their spatial transmission profiles.

In a second step, a set of basic pulses matching the k-space trajectory is selected. Unless explicitly stated otherwise, the term "pulse" always refers to the totality of all RF wave shapes emitted over a certain time interval, possibly across multiple RF transmission channels and antennas. As is explained in more detail below, this set of basic pulses does not have to be complete. In a series of MR experiments, these basic pulses are now applied one after the other in conjunction with the selected k-space trajectory as excitation pulses of the RF transmission antenna(s), wherein the k-space trajectory is always traversed completely and in the same way, irrespective of which basic pulse is being used. In individual cases, it may also be sufficient if the k-space trajectory is only traversed from the first instant at which the pulse amplitude differs from zero or starts a short time before that. However, this is only appropriate if it can be ensured that the progression of the k-space trajectory before this instant does not have any substantial effect on the trajectory after this instant. The result of each of these MR experiments for each single basic pulse is hereafter termed basic pattern. The basic patterns can, for example, be one-dimensional dependencies (e.g. slice profiles) or two or three-dimensional magnetic resonance images, depending on the type of spatial selection during excitation and on the acquisition method.

It must be ensured that the basic patterns linearly correlate with the basic pulses. This means, for example, that, for each linear superposition of basic pulses, the use of this superposition in such a calibration experiment would result in a pattern that corresponds to the equivalent superposition of the basic patterns associated with the individual basic pulses. With respect to excitation, such linear dependency obtains as long as one remains in the "small tip-angle" approximation mode. In this mode, the following applies to the complex excitation pattern as long as off-resonance and transverse relaxation effects are taken into account (here for the case of multi-channel excitation):

$$M_{xy}(x) = i\gamma M_0 \sum_n S_n(x) \int_0^T B_1(t) e^{ix \cdot k(t) + i\omega_{off}(x)(t-T) + \frac{1}{T_2^*(x)}(t-T)} dt \quad (1)$$

($M_{XY}(x)$) is the transverse magnetization pattern produced, x refers to the spatial coordinate, $\gamma$ refers to the gyromagnetic ratio of the examined spins, $M_0$ refers to the steady-state magnetization (basic magnetic field is oriented in the z direction), $B_{1,n}$ refers to the complex RF wave shape in array element n, $S_n$ refers to the spatial variation of the transmission field of array element n, k refers to the k-space trajectory, $\omega_{off}$ refers to the off-resonance frequency, $T_2^*$ refers to the effective transverse relaxation time, and T refers to the duration of the pulse. $M_{XY}$ and $B_{1,n}$ are complex quantities whose real and imaginary parts describe the relevant x or y component in the coordinate system rotating with the RF (vector quantities are printed in bold type).

If this excited transverse magnetization is now formed, for example, by means of Fourier imaging using a standard MRI imaging sequence, the complex images obtained are largely linearly dependent on the basic pulses if the sequence is such that the measurement signal is linearly dependent on the excitation flip angle. This means that it is important to ensure that no saturation effects occur, such as in the case of a gradient echo sequence with too short a repetition time.

The set of basic patterns obtained by the experiments described is now used as a basis for calculating the pulse required to achieve a certain desired excitation. Calculation is performed by determining the linear combination of basic patterns in a fit method that best matches a defined optimization criterion. Such an optimization criterion may be the approximation of a defined target pattern to the basic patterns. The quality of approximation can be defined using any cost function. A functional of the basic patterns can also be chosen directly as the cost function, in which case the linear combination of basic patterns that minimizes the functional is indirectly defined as the target pattern. If the linear combination of the basic patterns that minimizes the cost function is now found, the sought pulse can be calculated as the corresponding linear combination of basic pulses. Depending on the type of cost function, which can be a linear combination of the basic patterns, but equally well a non-linear function of the basic patterns, a suitable linear or non-linear optimization method must be selected. Such methods are known from prior art.

Such an optimization can be performed in a number of different ways. The simplest case would be for reception of the MR signal to be performed with a single homogeneous RF reception antenna by which a single MR image is obtained as the basic pattern for a single basic pulse. In this case, the basic pattern is proportional to the transverse magnetization produced by the pulse (generally not to the flip angle because the object can exhibit differing spin densities), neglecting relaxation effects. If the target pattern is now specified, the optimization method is now used to determine the pulse that produces a pattern of transverse magnetization that comes closest to the target pattern according to the cost function. To perform optimization for other parameters (for example the flip angle) the basic patterns must be corrected for the spin density in the object to obtain basic patterns that are proportional to the flip angle. It is also possible to acquire additional information during calibration and to modulate the basic patterns with this additional information as long as it is ensured that the linear relationship between the basic patterns and basic pulse is retained.

A somewhat more complex case applies if the signal is acquired with an array of m RF reception antennas. For each basic pulse, a single antenna basic pattern is acquired by each RF reception antenna. In this way, m sets of basic patterns are obtained for the one set of basic pulses. It is now possible to combine the m sets of basic patterns before pulse determination by linear combination of the single antenna basic patterns to form a single set of basic patterns, wherein only single antenna basic patterns of a certain basic pulse are combined in each of these linear combinations. Alternatively, it is also possible to form the identical linear combinations initially as part of pulse determination with the basic patterns inside each set and subsequently to unite the m intermediate patterns obtained in this way with any, even non-linear, combination to form a final pattern that should approximate a target pattern. In this case, identical linear combination means that the coefficient with which a certain basic pattern is weighted is the same for all basic patterns associated with a certain basic pulse, irrespective of their membership in a certain basic pattern set.

The method described has the great advantage that interference effects retaining the linear relationship between the pulse and excitation pattern, such as the imperfections of the MRI system, can be intrinsically taken into account in the pulse calculation method in a simple way and thus compensated for. Complex measurement of parameter maps, which are often unstable under difficult experimental conditions, is no longer necessary. Because the calibration is already performed in situ with the measurement sequence to be used later, additional disturbances usually expected due to changes in the measurement conditions are avoided.

Depending on the k-space trajectory used, the calibration step in the method described is more or less complex. To shorten the measuring time, it is possible to take advantage of symmetries of the experiment used to determine the basic patterns, or also previously known system properties to generate further basic patterns numerically from the subset of basic patterns. In this way, the experimental determination of the basic patterns can be reduced to this subset.

The following embodiment is intended to explain in more detail the invention with reference to the figures provided. The embodiment is correction of B1 inhomogeneities in a slice selective 2D MRI acquisition.

BRIEF DESCRIPTION OF THE DRAWING

The figures show:

FIG. 6 some examples of basic pulses used and the associated measured basic patterns;

DESCRIPTION OF THE PREFERRED EMBODIMENT

Figure 1:
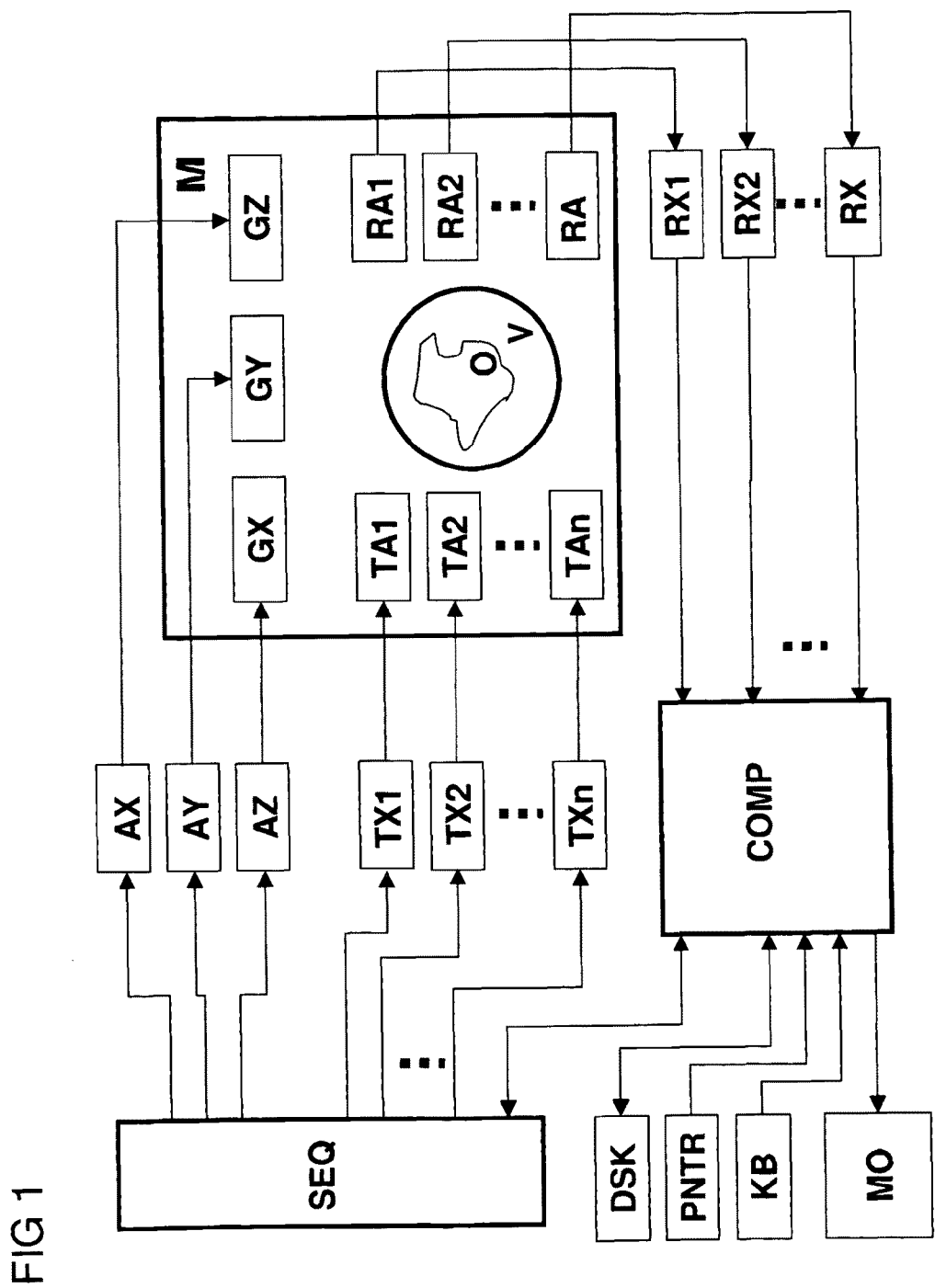
FIG. 1 schematic view of an MRI system suitable for performing the inventive method.

FIG. 1 shows a schematic view of an MR measurement system that is suitable for performing the inventive method. The system contains a main magnet M, with which the essentially homogeneous and static basic magnetic field is produced in an examination volume V. Three sets of gradient coils GX, GY, and GZ surround this examination volume V and are put into the bore of the main magnet M to superpose additional magnetic fields with constant gradients of controllable duration and strength on the basic field. Gradient amplifiers AX, AY, and AZ are switched by the sequence control unit SEQ to produce gradient pulses at the right instant. The gradient coils GX, GY, GZ are supplied with electrical power to produce the essentially linear gradient fields.

Within the gradient field system, there are multiple RF transmission antennas TA1 to TAn that are collectively termed a transmission array comprising n elements. They surround an object under examination O and are powered from multiple independent RF power transmitters TX1 . . . TXn. The pulses produced by these RF pulses are determined by the sequence control unit SEQ and triggered at the correct time. With the RF transmission antennas TA1 to TAn, RF pulses are irradiated onto the object under examination O in the volume under examination V where they excite nuclear spins (also see FIG. 2). The magnetic resonance signals resulting therefrom are converted into electrical voltage signals that are then fed to a number of reception units RX1 to RXm with one or more RF reception antennas RA1, ..., RAm, collectively termed a reception array comprising m elements. They are also located within the gradient coils GX, GY, GZ, and surround the object under examination O. To reduce the complexity of the apparatus, the antenna system can be designed and connected in such a way that one or more of the RF transmission antennas TA to TAn are also used to receive the magnetic resonance signals. In such a case (not taken into account in FIG. 1), switchover between transmission and reception modes is assured by one or more electronic transmission-reception switches controlled by the sequence control unit SEQ. During the RF transmission phases of the executed pulse sequence, this antenna or these antennas are connected to the corresponding RF power transmitter or transmitters and disconnected from the allocated reception channel or channels. For the reception phases, transmitter disconnection and reception channel connection is performed. With the reception units RX1 to RXm shown in FIG. 1, the received signals are amplified and converted to digital signals using known signal processing methods and passed on to the electronic computer system COMP. In addition to reconstruction of images from the measured data received, the control computer system COMP is used to operate the entire MR measurement system and to initiate execution of the pulse sequences by appropriate communication with the sequence control unit SEQ. User-guided or automatic execution of programs for adjusting the measurement system characteristics and/or for generating magnetic resonance images is also performed by this control computer system COMP, as are visualization of the reconstructed images and storage and administration of the measurement and image data and control programs. For these tasks, this computer system is equipped with at least one processor, a working memory, a computer keyboard KB, a pointing device PNTR, for example, a computer mouse, a monitor MON, and an external digital storage unit DSK.

Figure 2:
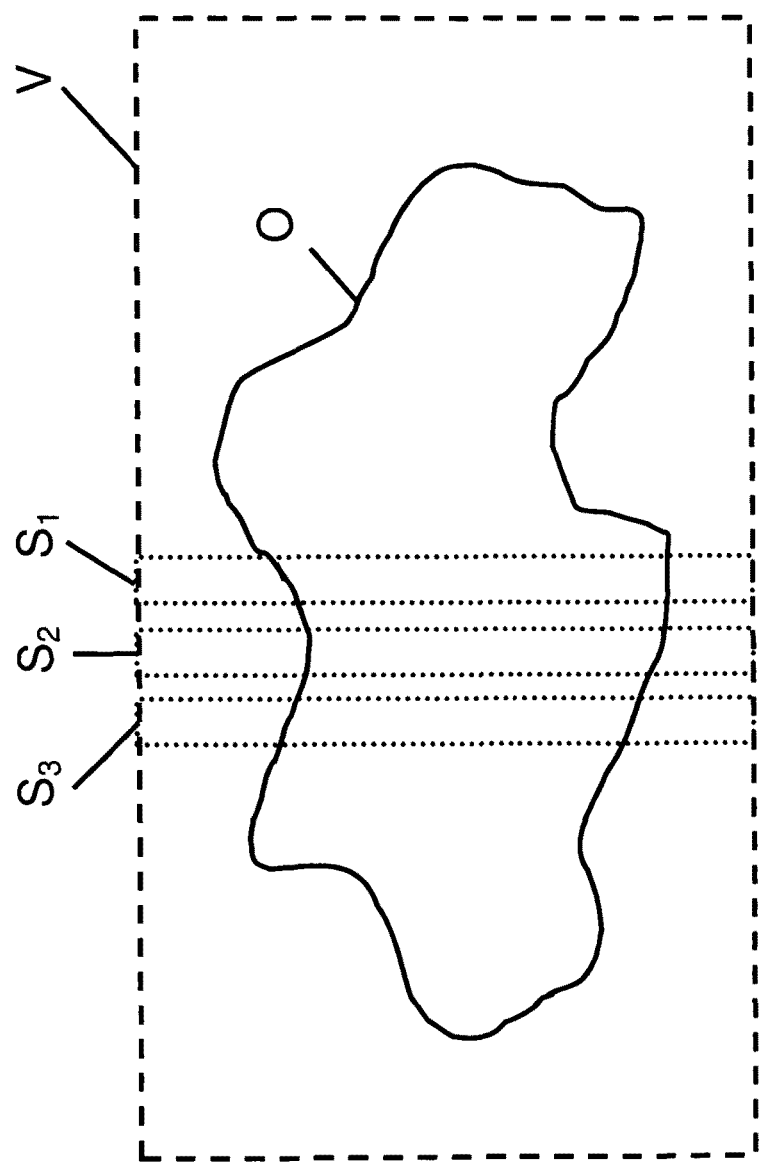
FIG. 2 schematic view of an object to be examined with the slices in which mapping is to be performed.

To illustrate the imaging situation, FIG. 2 shows an object to be examined O within a volume to be examined V of the magnetic resonance system. In this case, acquisitions are to be made of one or more slices $S_1$, $S_2$, $S_3$ etc. (in this case shown greatly magnified). In the example, the intention is to achieve the most homogeneous image profile possible within the slices $S_1$, $S_2$, $S_3$ by selective excitation.

Figure 3:
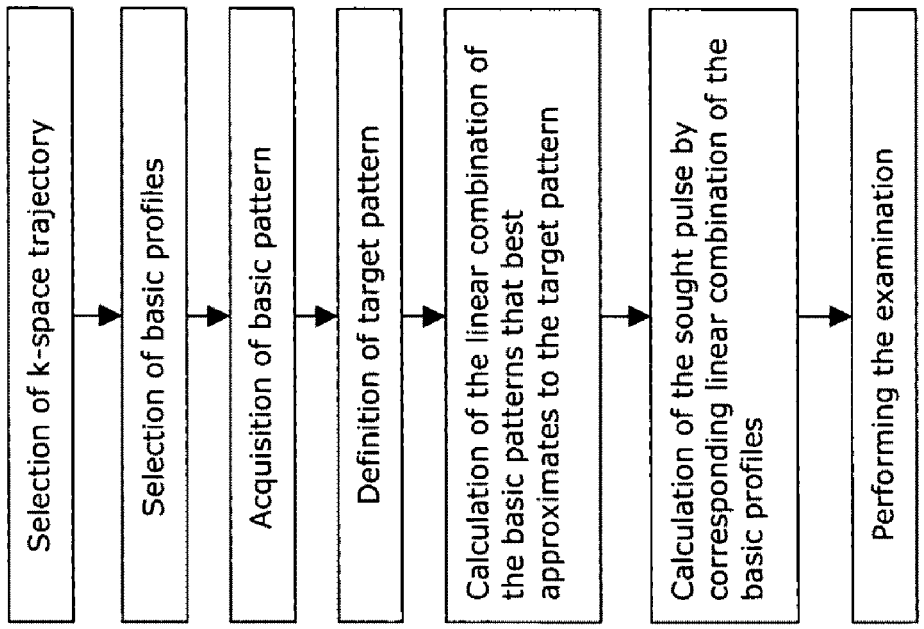
FIG. 3 flowchart of a possible sequence of calibration step, calculation step, and examination.
Figure 4:
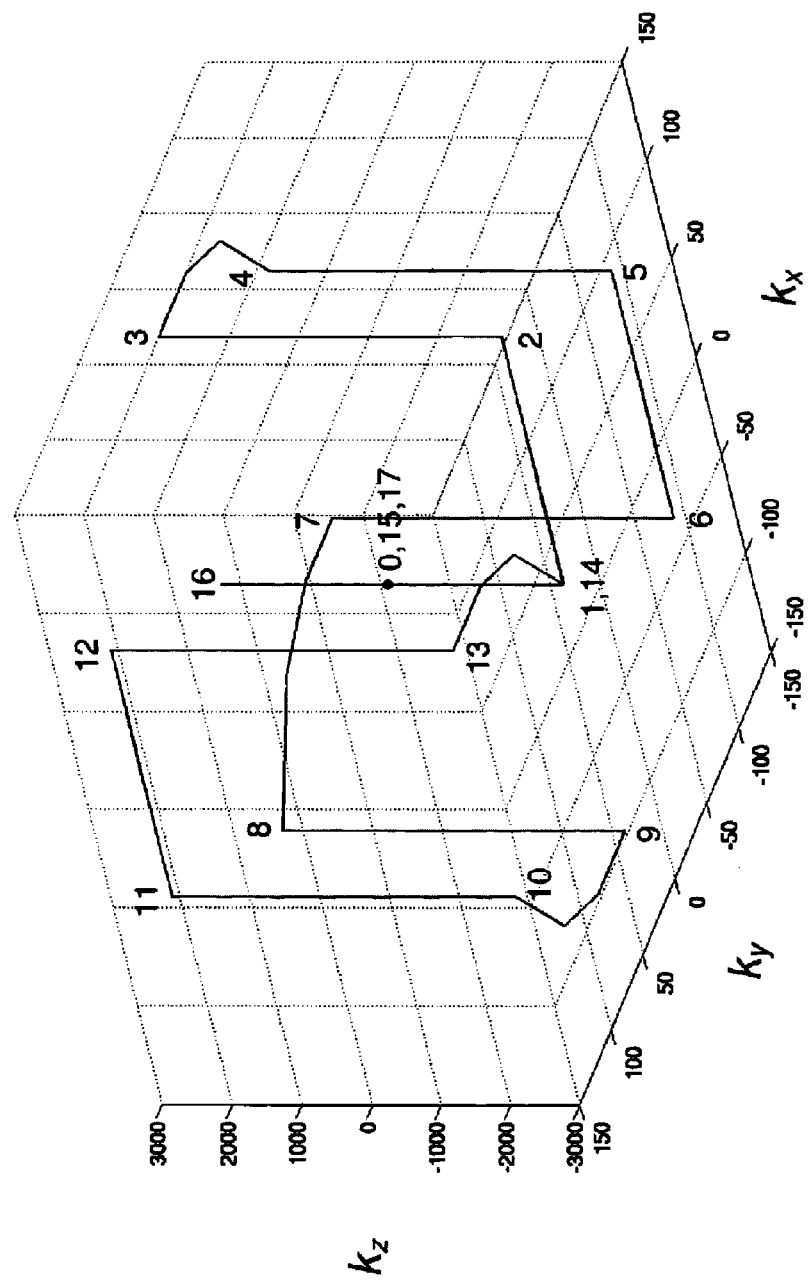
FIG. 4 schematic view of the k-space trajectory used for the excitation.

FIG. 3 shows a possible measuring sequence. The measuring sequence starts by selecting a k-space trajectory adapted to the problem. Because slice selective excitation is to be performed in this example, wherein inhomogeneities of the B1 field varying slowly over space are to be corrected within the slice, a k-space trajectory as shown in FIG. 4 is appropriate. (The trajectory is traversed with the ascending numbering 0 to 17.) Trajectories of this type have been suggested by Saekho et al. [7]. During traversal of such a trajectory, slice-selective sub-pulses are irradiated, preferably only while the trajectory parts oriented in the z direction, also termed spokes, are being traversed (2-3, 4-5, 6-7, 8-9, 10-11, 12-13, 14-16). These sub-pulses have an identical shape but can vary in global amplitude and phase depending on the xy position in the trajectory. In this way, slice selection in the z direction is achieved, but at the same time modulation of the traversed magnetization profile within the slice is also obtained in the xy plane.

Figure 5:
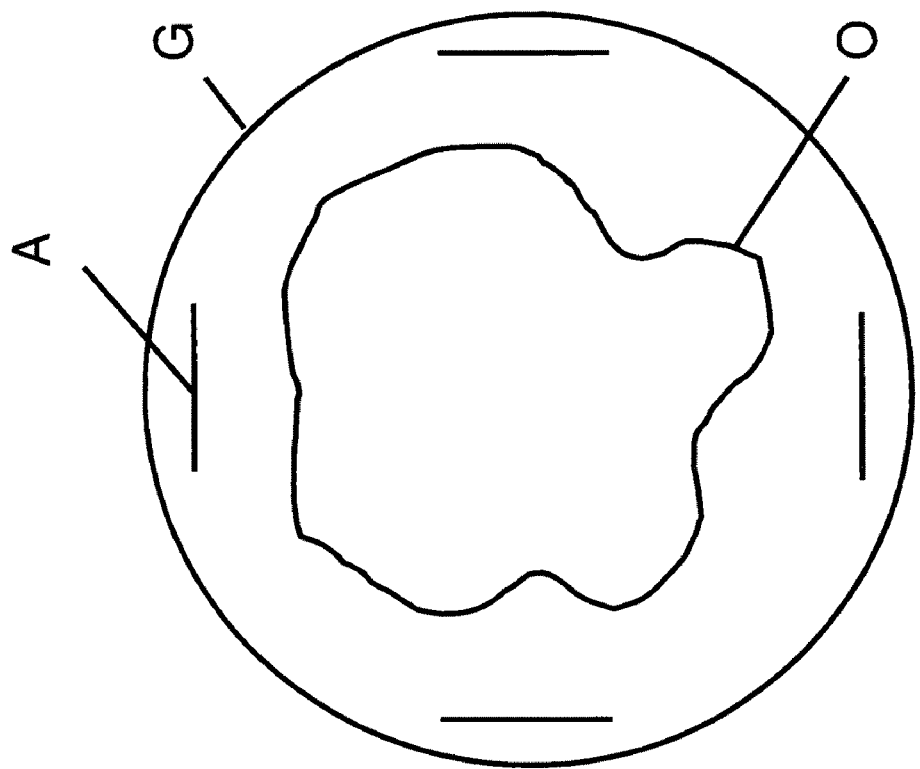
FIG. 5 schematic view of the RF transmission antenna array used.

After the k-space trajectory has been defined, matching basic pulses are now defined. In the present case, the k-space trajectory has seven spokes in the z direction during which the slice selective sub-pulses can be applied. Moreover, in this example, excitation with a four-element transmission array is assumed that is driven by four independent transmission channels. FIG. 5 schematically shows this transmission array. It consists of a housing G, in which in this case, four array elements A are mounted that are disposed with rotational symmetry around the object under examination O. In this case, calculation of the RF pulse for a certain target pattern is performed by determining the amplitude and phase of the sub-pulse for all seven positions in k-space and all four array elements, which, in mathematical terms, involves the calculation of 28 complex coefficients. For that reason, a set of 28 complex basic pulses was selected for the calibration. The simplest basic set for this case is one in which each basic pulse, precisely during one of the seven spokes in precisely one array element, contains one sub-pulse with unit amplitude and phase 0. However, this is only one of, in principle, an infinite number of possible basic sets. Basic pulses can also be selected, in which non-vanishing sub-pulses occur at multiple k-space positions and in multiple array elements. It is only important that the basis is linearly independent, that is, no basic pulse can be represented as a linear superposition of other basic pulses.

After selection of the basic pulses, the measurements of the basic patterns are now performed. For this purpose, the position of the slices must initially be selected that will later also be used in the actual examination. In this case, a standard gradient echo sequence was used for the acquisition in which the excitation pulse was replaced with the described slice-selective pulse having $B_1$ correction. Data acquisition was performed with the same array as transmission. The data from the four reception channels were combined in the image space as if the array had been operated as a birdcage reception resonator with a phase difference of 90° between adjacent elements. One complex image is thus obtained for each calibration element and slice. To ensure linearity between the excitation patterns and MR image, it is important to ensure that the excitation flip angle is selected for the basic pulses in such a way that it is clearly smaller than the Ernst angle in dependence on the repetition time of the gradient echo sequence.

FIG. 6b shows an example in which basic patterns were produced, in this case via a number of selected basic pulses in an axial sectional plane of a water bottle. In this example, work was only performed with one slice without restricting general applicability. FIG. 6a first shows four different basic pulses that were emitted in the transmission array during the calibration experiments. Each diagram shows one basic pulse with its components emitted in the respective array elements, with only the amplitude depicted because the phase was always identical and equal to zero. FIG. 6b shows the magnitude images of the basic patterns produced—the intensity is scaled to the maximum of the four magnitude images—and the graphical view of the phase dependency (in rad). In experiments 1 and 3, transmission was only performed with element 1 in each case, but at different positions of the trajectory. For that reason, the same magnitude image is obtained except for minimal effects of transverse relaxation, but there are differences in the phase dependency. For experiments 2 and 4, transmission was only performed with element 2. For that reason, the basic patterns also differ from those of experiments 1 and 3 with respect to their magnitude image.

Figure 7:
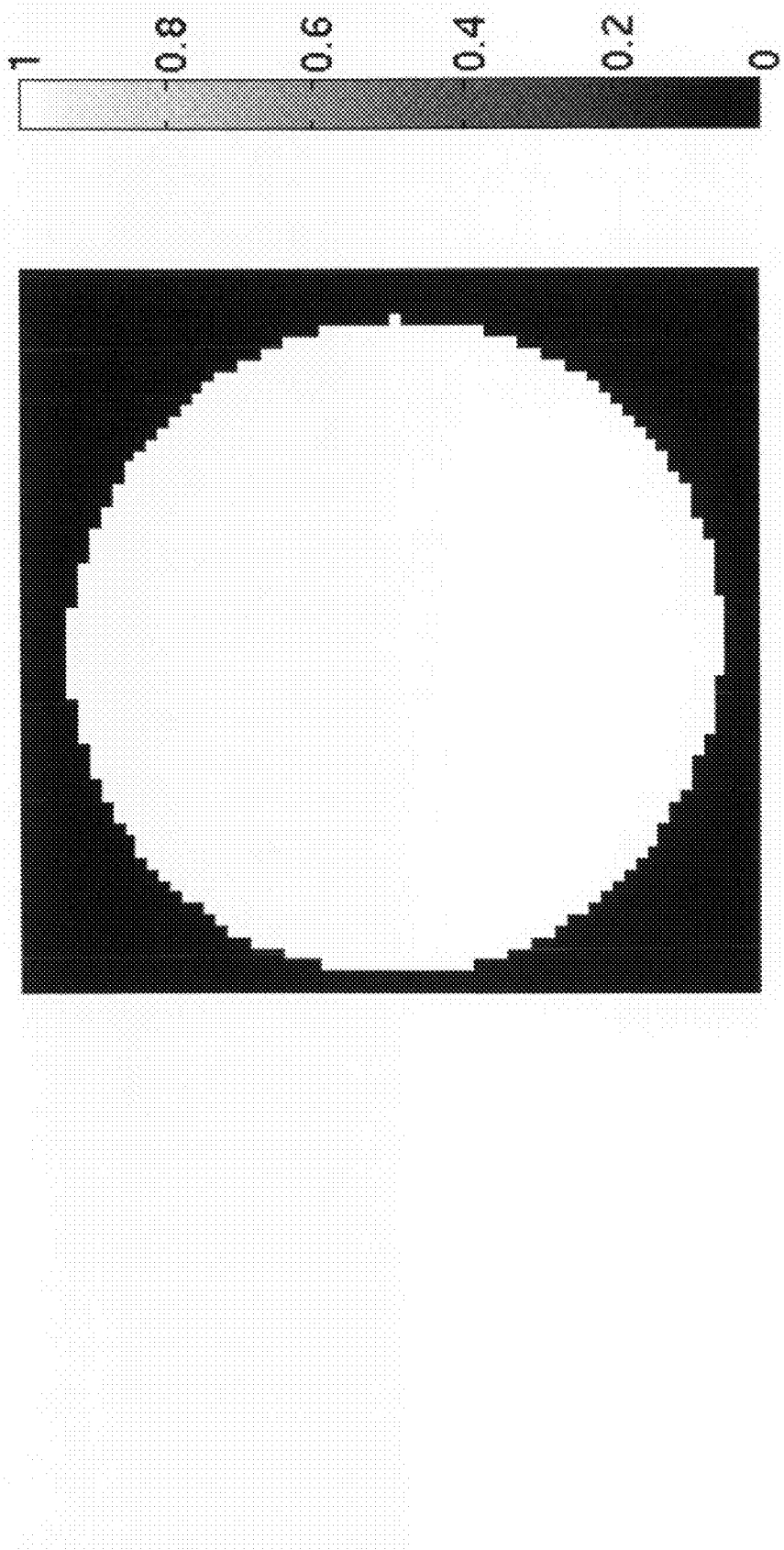
FIG. 7 a possible target pattern.
Figure 8:
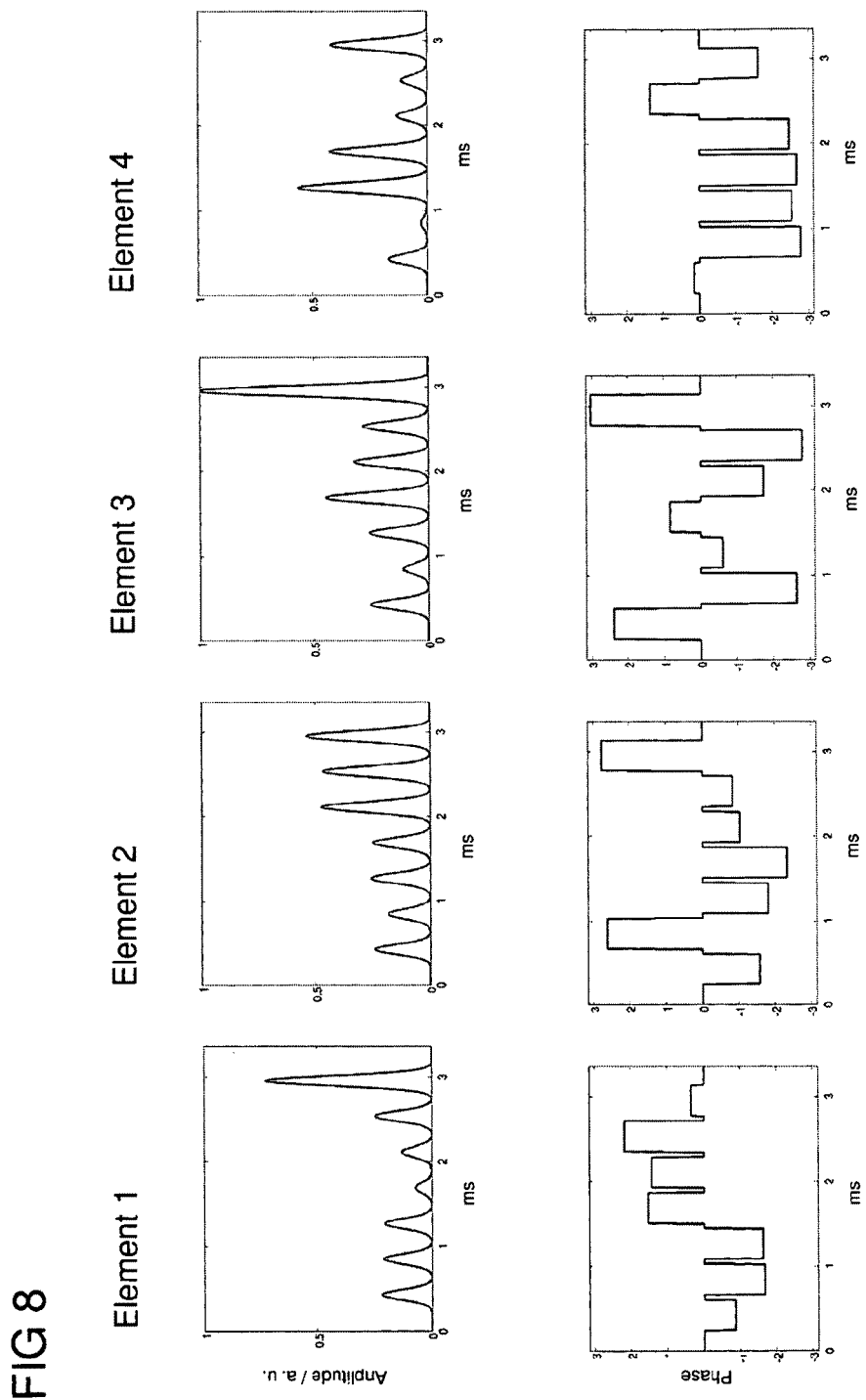
FIG. 8 the calculated pulse for producing the target pattern of FIG. 7.

After acquisition of all basic patterns, calculation of the pulse for a desired target pattern can now be performed. In this example, a homogeneous image with a phase dependency that is constantly equal to 0 was defined as the target pattern. The magnitudes of this image are shown in FIG. 7. The sought 28 complex coefficients are now obtained by fitting the complex basic patterns to the target pattern. A simple approximation criterion in this case is the least square deviation of the linear combination of the basic patterns from the target pattern. FIG. 8 shows the amplitudes and phase dependencies of the pulse determined in this way for excitation of the target pattern.

Figure 9:
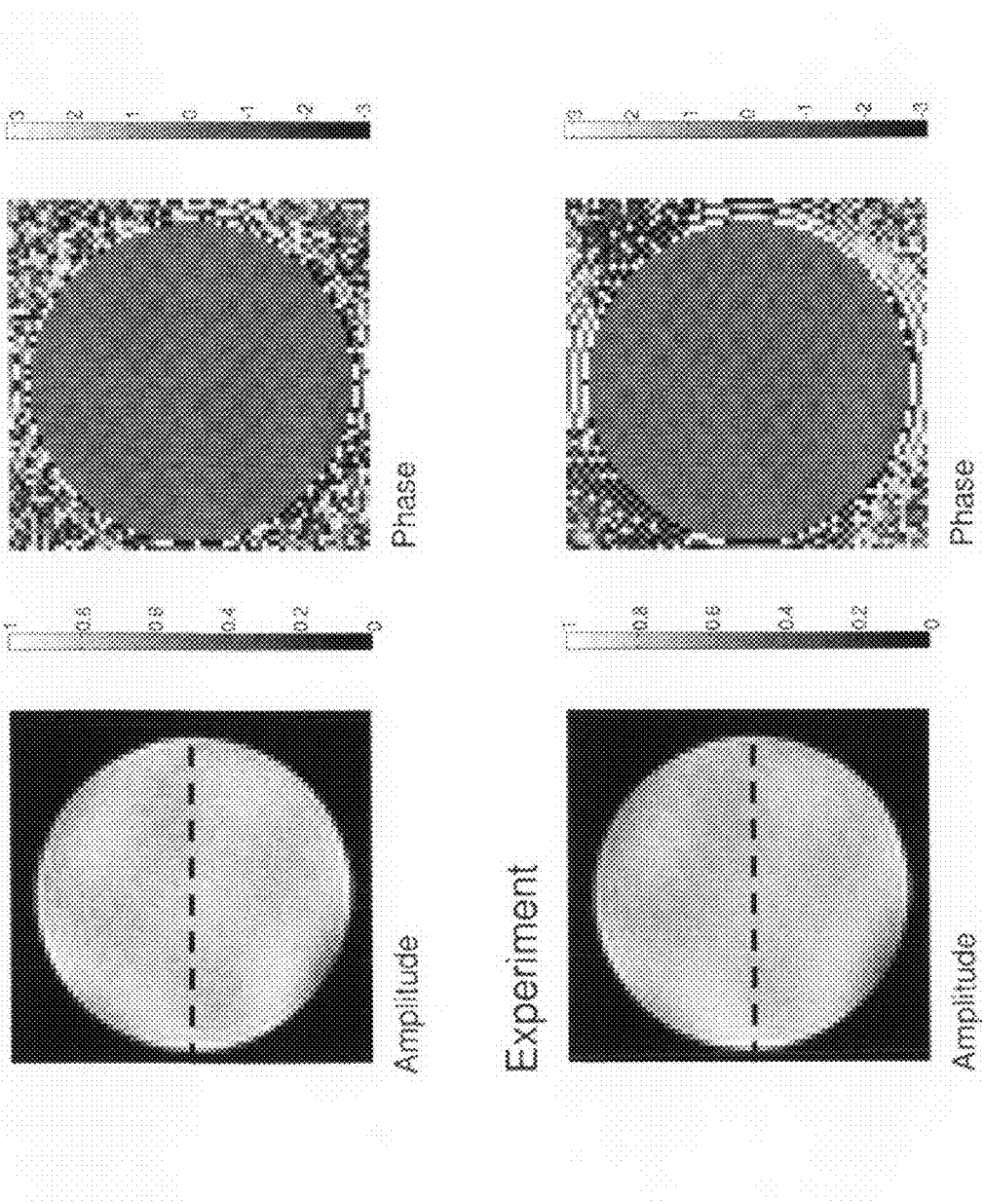
FIG. 9 patterns obtained numerically and experimentally using the calculated pulse from FIG. 8.
Figure 10:
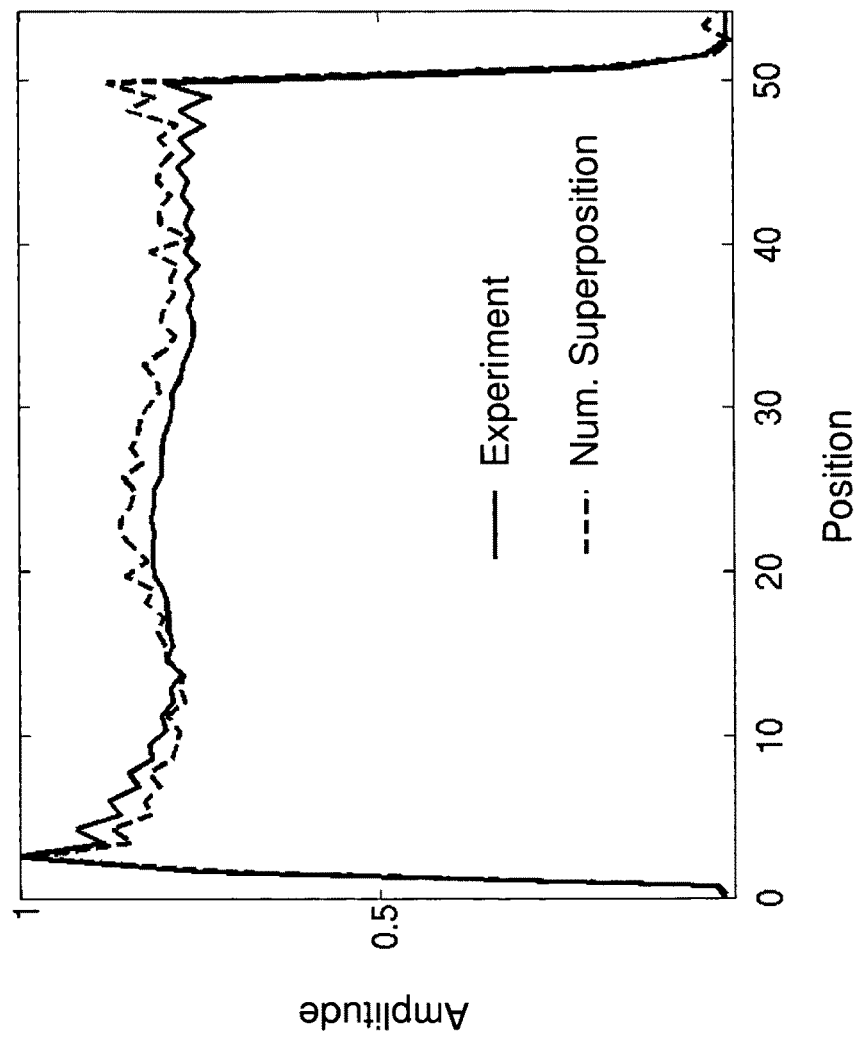
FIG. 10 comparison of sections through the patterns obtained numerically and experimentally in FIG. 9.

FIG. 9 shows the pattern obtained if the basic pattern is numerically superposed with the calculated coefficients. Moreover, the result of an MR experiment using the determined pulse is depicted, showing a very good match with the numeric superposition. This is again confirmed by FIG. 10 in which two sections of the magnitude images of FIG. 9 are compared (taken along the dashed lines drawn therein).

At this point it is again explicitly indicated that the embodiment, as described above, primary results in an image with a homogeneous magnitudes if the reception signals are combined as described. This is not necessarily identical with a homogeneous distribution of the transverse magnetization produced, because the signal reception or the combination of reception signals does not have to be spatially homogeneous, which is the case in this example. To achieve a homogeneous distribution of the transverse magnetization, the basic patterns would initially have to be corrected with the spatial sensitivity profile of the reception mode used. To also achieve a homogeneous flip angle the spin density profile of the object to be mapped would also have to be taken into account.

A more direct way of obtaining a homogeneous flip angle distribution in this case is to acquire a map of the magnitudes of the transmission field of each array element in addition to the basic patterns and to multiply the magnitudes of the basic patterns by a spatial function that is different for each transmission array element but identical for the same element for all k-space positions, so that the basic pattern associated with each element is equal in magnitudes to the relevant transmission field map in the center of the k-space. If the pattern thus obtained is fitted to a homogeneous pattern, a pulse is obtained that produces a homogeneous flip angle distribution.

One important aspect of the method described in this invention is also the duration of the calibration step. As indicated above, it is not always necessary to determine all basic patterns experimentally. It may be possible to determine one part of the basic patterns from the remainder by symmetry considerations and previously known system properties. As long as transverse relaxation effects are neglected, in this example, the basic pattern can be constructed from the product of the magnitude and phase distribution determined by the transmission profile of the array element and an additional spatially varying phase specified by the position of the spoke in the k-space trajectory, which is, however, constant for all elements. It would thus be sufficient to determine those basic patterns experimentally that are associated with the basic pulses that apply a sub-pulse in the various array elements during the central spoke. Moreover, it would be necessary to determine the basic patterns associated with all spokes for one of the elements and would then be possible to calculate the remaining basic patterns from these measured patterns. This would reduce the number of calibration experiments from n×p to n+p−1 (p: number of spokes in the k-space trajectory, n: number of array elements). In this example, this would be a reduction by a factor of 2.8 from 28 to 10 experiments.

The inventive method permits the determination of RF pulses suitable for one or mufti-channel spatially selective excitation by the generation of individual basic patterns and by the inventive linear combination of the basic patterns, wherein experimental imperfections are taken into account and intrinsically compensated for. The sought pulses are determined by a linear combination corresponding to the linear combination of the basic patterns.

REFERENCES

[1] Pauly, J.; Nishimura, D.; Macovski, A.: A k-space analysis of small-tip-angle excitation. In: Journal of Magnetic Resonance 81 (1989), p. 43-56
[2] Katscher, U.; Börnert, P.; Leussler, C.; van den Brink, J. S.: Transmit SENSE. In: Magnetic Resonance in Medicine 49 (2003), p. 144-150
[3] Schomberg, H.; Börnert, P.: Off-resonance correction of nD spatially selective RF pulses. In: Proceedings 6th Scientific Meeting, International Society for Magnetic Resonance in Medicine, Sydney, 1998, p. 2059
[4] Börnert, P.; Aldefeld, B.: On spatially selective RF excitation and its analogy with spiral MR image acquisition. In: Magnetic Resonance Materials in Physics, Biology and Medicine 7 (1998), p. 166-178
[5] Yip, C. Y.; Fessler, J. A.; Noll, D. C.: Iterative RF pulse design for multidimensional, small-tip-angle selective excitation. In: Magnetic Resonance in Medicine 54 (2005), p. 908-917
[6] Grissom, W.; Yip, C. Y.; Zhang, Z.; Stenger, V. A.; Fessler, J. A.; Noll, D. C.: Special domain method for the design of RF pulses in multicoil parallel excitation. In: Magnetic Resonance in Medicine 56 (2006), p. 620-629
[7] Saekho, S.; Yip, C. Y.; Noll, D. C.; Boada, F. E.; Stenger, V. A.: Fast-kz three-dimensional tailored radio frequency pulse for reduced B1 inhomogeneity. In: Magnetic Resonance in Medicine 55 (2006), p. 719-724

I claim:

1. A method for determining amplitude and phase dependencies of radio frequency pulses that are irradiated during traversal of a specified k-space trajectory to produce an n-dimensional spatial pattern (n>=1) of transverse magnetization in an object as part of a spatially resolved magnetic resonance experiment using at least one RF transmission antenna of a magnetic resonance measurement system, the method comprising the steps of:
    a) defining a set of basic pulses, a pulse being a totality of all RF wave shapes emitted by the at least one RF transmission antenna used during a transmission operation;
    b) individually irradiating the basic pulses of the set, thereby traversing the specified k-space trajectory;
    c) producing at least one set of basic patterns through detection of MR signals excited through irradiation of the basic pulses in step b), wherein, at least in a range of the object to be examined, each basic pattern is proportional to a complex transverse magnetization produced by each basic pulse, the k-space trajectory being traversed in a fully identical manner for each basic pulse, at least from a beginning of irradiation of a respective basic pulse;
    d) approximating a defined target pattern using a linear combination of the basic patterns of the set or using a mathematical relationship among intermediate patterns generated through identical linear combination of the basic patterns within each set; and
    e) determining the amplitudes and phase dependencies of the desired RF pulses using a corresponding linear combination of the basic pulses.

2. The method of claim 1, wherein multiple RF reception antennas are used for production of the basic patterns, wherein a separate set of basic patterns is acquired by each respective RF reception antenna of a reception device.

3. The method of claim 1, wherein prior to steps d) and e) a single set of basic patterns is produced from multiple sets of basic patterns by linear combination of different basic patterns, each produced by a certain basic pulse.

4. The method of claim 1, wherein linear combinations with which, within each set, the basic patterns are identically combined are mathematically associated in a non-linear manner.

5. The method of claim 4, wherein the linear combinations are mathematically associated by summation of squares of magnitudes.

6. The method of claim 1, wherein sets of defined basic pulses and the associated basic patterns are incomplete and are complemented by utilization of previously known system properties.

7. The method of claim 6, wherein the known system properties are symmetries.

8. The method of claim 1, wherein, during steps d) and e), the sets of measured basic patterns are modified by utilization of previously known system properties.

9. The method of claim 1, wherein during steps d) and e) the sets of measured basic patterns are modified by utilization of previously known object properties.

10. The method of claim 1, wherein the target pattern is an MR image.

11. The method of claim 8, wherein the target pattern is a spatial distribution of the transverse magnetization, wherein a reception characteristic of a reception device is taken into account in steps d) and e).

12. The method of claim 9, wherein the target pattern is a spatial distribution of the transverse magnetization, wherein a reception characteristic of a reception device is taken into account in steps d) and e).

13. The method of claim 8, wherein the target pattern is a target flip angle distribution, wherein a reception characteristic of the reception device and a spin density distribution in the object are taken into account in steps d) and e).

14. The method of claim 9, wherein the target pattern is a target flip angle distribution, wherein a reception characteristic of the reception device and a spin density distribution in the object are taken into account in steps d) and e).

15. The method of claim 1, wherein the target pattern is indirectly defined by minimizing a functional defined from linear combinations of the basic patterns.

* * * * *